United States Patent [19]

Vogt, III et al.

[11] Patent Number: 5,444,759
[45] Date of Patent: Aug. 22, 1995

[54] METHOD OF PREDICTING VOLTAGES IN TELEPHONE LINE MEASUREMENT

[75] Inventors: John V. Vogt, III, Norcross; Charles E. Summers, Canton, both of Ga.

[73] Assignee: Northern Telecom Limited, Montreal, Canada

[21] Appl. No.: 123,085

[22] Filed: Sep. 20, 1993

[51] Int. Cl.⁶ ............... H04M 3/08; H04M 3/22; H04M 1/24
[52] U.S. Cl. ................. 379/30; 379/32; 379/34; 379/1; 379/24; 324/713
[58] Field of Search ........... 379/1, 6, 20, 22, 24, 379/26, 30, 34, 27; 324/616, 713, 429, 433, 111

[56] References Cited

U.S. PATENT DOCUMENTS

| Re. 30,692 | 7/1981 | Ellson | 179/175.3 R |
|---|---|---|---|
| 4,006,319 | 2/1977 | Gartner | 179/175.3 R |
| 4,028,507 | 6/1977 | Hoppough | 179/175.3 R |
| 4,514,694 | 4/1985 | Finger | 324/429 |
| 4,895,737 | 7/1989 | Ohbandorf et al. | 379/30 |

FOREIGN PATENT DOCUMENTS

| 0303142 | 2/1989 | European Pat. Off. | H04M 3/30 |
|---|---|---|---|
| 4125882 | 2/1993 | Germany | H04M 3/30 |
| 4125883 | 2/1993 | Germany | H04M 3/30 |

OTHER PUBLICATIONS

"Subscriber Line Testing for Digital Switching Offices", IEEE Transactions On Communications, vol. COM-29, No. 10, Oct. 1981 T. A. Hanrahan et al, pp. 1434–1441.

Lewis, Frank L., "Applied Optimal Control & Estimation-Digital Design & Implementation", Prentice Hall publisher, pp. 257–259.

Primary Examiner—Stephen Chin
Assistant Examiner—Paul Loomis
Attorney, Agent, or Firm—Foley & Lardner

[57] ABSTRACT

For measuring characteristics (resistance, capacitance, and foreign voltage) on a telephone line, source voltages are coupled via source resistances to the line in three test conditions and the parameters are calculated from steady state voltages at the terminals of the line. Each steady state voltage is predictively calculated from nine samples of the voltage at the terminal using a closed form second order solution of a circuit model of the telephone line derived from a transformation of the circuit model into the Z domain and using the matched pole-zero technique. The steady state voltages can thus be determined without waiting for transients, due to the time constants of the telephone line, to die out, resulting in much faster measurements for telephone lines with large time constants.

14 Claims, 2 Drawing Sheets

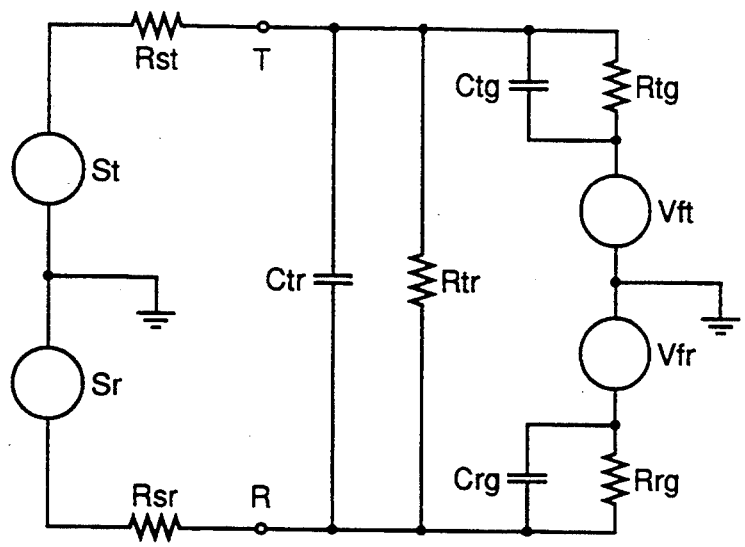
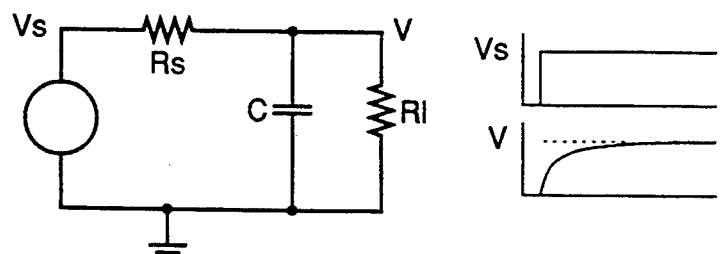
Fig. 1 PRIOR ART
Fig. 2 PRIOR ART
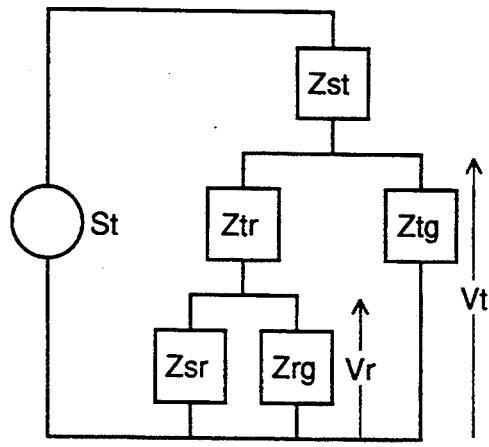
Fig. 4
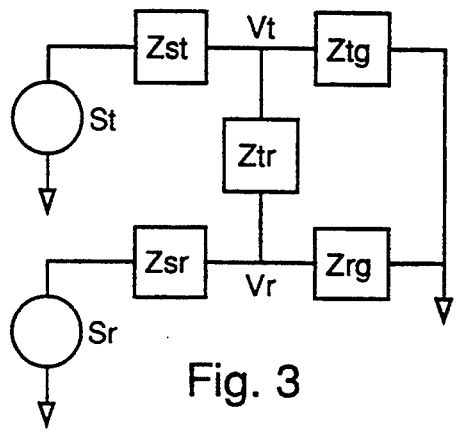
Fig. 3

METHOD OF PREDICTING VOLTAGES IN TELEPHONE LINE MEASUREMENT

This invention relates to the measurement of characteristics of telephone lines, and is particularly concerned with a method of predicting final or steady state voltages during such measurement.

BACKGROUND OF THE INVENTION

In Ellson U.S. Pat. No. Re. 30,692 reissued Jul. 28, 1981 (reissue of U.S. Pat. No. 4,186,282 issued Jan. 29, 1980) entitled "Method And Apparatus For Measuring Telephone Line Characteristics" there is described a method and apparatus for deriving parameters of a telephone line from current and charge flow measurements taken during three successive voltage states applied to the tip and ring wires of the line via series resistors of known resistance. The parameters include, in particular, resistances, capacitances, and foreign voltages of the line.

Due to the characteristics of the line, each of the successive voltage states produces transient voltages. For sufficiently accurate measurement results, final value or steady state voltage measurements are required, and these have traditionally been performed after the transient voltages have died, for example in the Ellson patent by waiting for two successive identical measurement samples. Although the Ellson patent indicates that a test period may typically be less than three seconds, it recognizes that the measurement time is directly related to the leakage resistance and the capacitance of the telephone loop.

The time required for a transient to die may in fact be as long as 500 seconds (5 times the time constant of a line with a loop capacitance of 10 $\mu$F with a resistance to ground of 10 M$\Omega$). A telephone operating company may wish to measure the parameters of all telephone lines on a nightly basis in order to detect potential problems as quickly as possible, with a consequent need for high speed measurements, but this is not practical with such long waiting times to allow transients to die so that steady state measurements can be made as in the Ellson patent.

In an attempt to avoid this difficulty, it is known to reduce the time constant of the line by driving it with a low impedance, but this can result in inaccurate measurement results. Inaccurate results are also produced if measurements are performed before the transients have completely died, so that the voltage measurements used are not the final value or steady state voltages.

An object of this invention is to provide an improved method of measuring characteristics of a two-wire telephone line.

SUMMARY OF THE INVENTION

According to this invention there is provided a method of measuring characteristics of a two-wire telephone line a circuit model of which comprises resistive and capacitive elements connected between tip, ring, and ground terminals of the line, comprising the steps of: coupling source voltages via source resistances to the tip and ring terminals in a plurality of test conditions; in each test condition, determining a steady state voltage of at least one of the tip and ring terminals; and deriving characteristics of the resistive elements of the line from the source voltages, source resistances, and determined steady state voltages; wherein the step of determining each steady state voltage of a terminal comprises the steps of: sampling the voltage at the terminal with a predetermined sampling period to provide a predetermined set of sampled voltages; and calculating a predicted voltage value, constituting the determined steady state voltage, from the predetermined set of sampled voltages using a closed form second order solution of the circuit model.

The closed form second order solution of the circuit model is produced as described in detail below by transforming the circuit model into the Z domain and using the matched pole-zero (MPZ) technique to derive a set of independent linear equations which are solved to enable the predicted steady state voltage to be precisely calculated (i.e. in a closed form manner which always produces a specific result, rather than in an iterative manner).

The solution described below requires that the predetermined set of sampled voltages comprise nine samples. These can comprise three sets each of three consecutive samples, with the predicted voltage value being equal to $b2/(1+a1+a2)$, where a1, a2, and b2 are determined by three linear independent equations, one for each of the three sets, having the form $Y3 = b2 - a1\, Y2 - a2\, Y1$ where Y1 to Y3 are the three consecutively sampled voltages in the respective set.

Preferably, for the most rapid prediction, the predetermined set of sampled voltages comprises nine consecutive samples. In this case the solution for the steady state voltage is given by the equations:

$$a1 = (Y3(Y7-Y4) + Y6(Y1-Y7) + Y9(Y4-Y1))/Y$$

$$a2 = (Y3(Y5-Y8) + Y6(Y8-Y2) + Y9(Y2-Y5))/Y$$

$$b2 = (Y3(Y7Y5 - Y8Y4) + Y6(Y8Y1 - Y7Y2) + Y9(Y4Y2 - Y5Y1))/Y$$

$$Y = Y7Y5 - Y8Y4 - Y7Y2 - Y7Y2 + Y4Y2 + Y8Y1 - Y5Y1$$

where Y1 to Y9 are the nine consecutively sampled voltages.

The circuit model typically comprises tip-to-ring, tip-to-ground, and ring-to-ground resistances and tip and ring foreign voltages; in this case the plurality of test conditions conveniently comprise three different test conditions which provide five equations by which the resistances and foreign voltages are derived from the source voltages, source resistances, and determined steady state voltages. The circuit model typically further comprises tip-to-ring, tip-to-ground, and ring-to-ground capacitances, and the three different test conditions can provide three equations in the time domain by which the capacitances are derived.

The predetermined sampling period is preferably an integer multiple of the period of a 60 Hz ac waveform, conveniently 100 ms, in order to cancel from the measurement any induced ac voltages.

BRIEF DESCRIPTION OF THE DRAWINGS

The invention will be further understood from the following description with reference to the accompanying drawings, in which:

FIG. 1 illustrates a circuit model for measurement of parameters of a telephone line;

FIG. 2 is a diagram illustrating the transient effects due to the time constant of a circuit whose resistance is to be measured;

FIG. 3 illustrates a Laplace impedance model of the circuit of FIG. 1;

FIG. 4 illustrates a modified Laplace impedance model of the circuit of FIG. 1.

DETAILED DESCRIPTION

Figure 5:
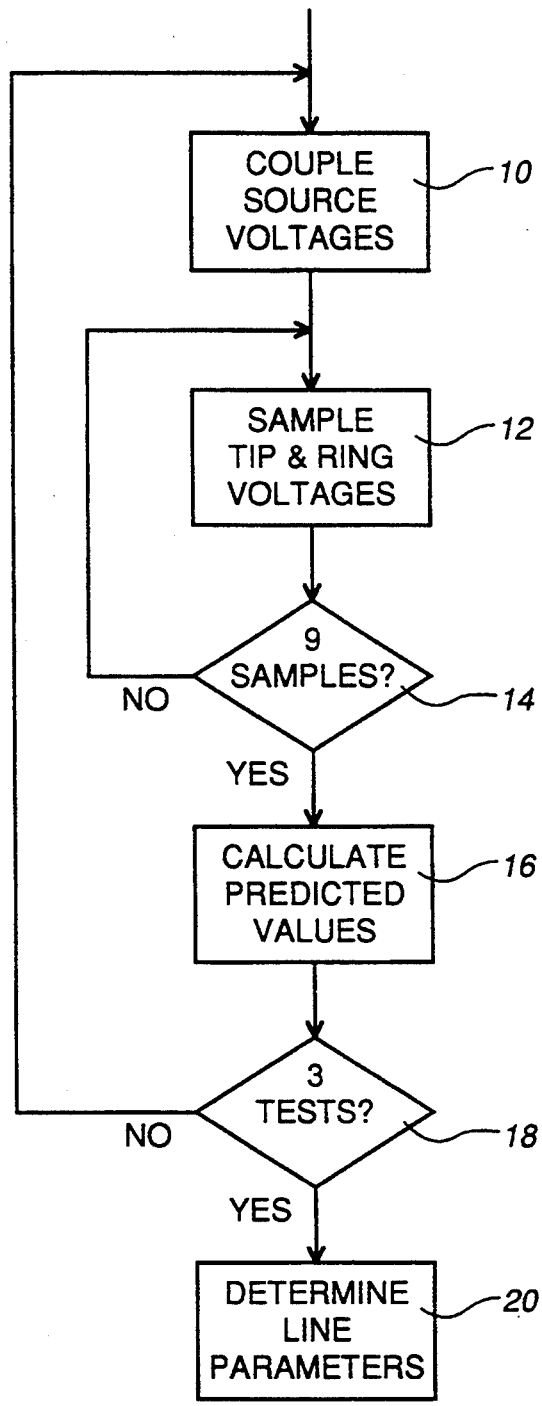
FIG. 5 is a flow chart showing the method steps of the invention.

Referring to FIG. 1, there is illustrated a circuit model of a two-wire telephone line having tip and ring wires with terminals T and R respectively. Characteristics of the line represented in this circuit model comprise tip to ring capacitance Ctr and resistance Rtr, tip to ground capacitance Ctg and resistance Rtg, ring to ground capacitance Crg and resistance Rrg, and foreign DC potentials Vft and Vfr on the tip and ring wires respectively. For measurement purposes, a tip source voltage St is applied to the terminal T via a series resistor Rst, and a ring source voltage Sr is applied to the terminal R via a series resistor Rsr.

The circuit model of FIG. 1 can be seen to correspond to the arrangement of components representing the telephone line characteristics in FIG. 1 of U.S. Pat. No. Re. 30,692 already referred to, which also illustrates one form of apparatus which may be used for supplying the source voltages St and Sr and for measuring DC voltages Vt and Vr consequently produced at the terminals T and R respectively. As apparatus for carrying out the method of this invention is known in the art of telephone line measurement, it need not be, and is not, further described here.

Direct measurement of the components in the circuit model of FIG. 1 is not possible; i.e. connecting a volt-ohmmeter between the terminals T and R of the line would not give individual component values. To determine the values of the individual components, referred to as the three terminal result, multiple tests must be performed to provide parameters for the solution of a set of simultaneous linear node equations. Each test involves the application of a different combination of source voltages St and Sr and measurement of the resulting final value or steady state voltages Vt and Vr.

For each test, the following two equations apply:

$$\frac{Stn}{Rst} + \frac{Vft}{Rtg} + \frac{Vrn}{Rtr} = Vtn\left(\frac{1}{Rst} + \frac{1}{Rtg} + \frac{1}{Rtr}\right) \quad (1)$$

$$\frac{Srn}{Rsr} + \frac{Vfr}{Rrg} + \frac{Vtn}{Rtr} = Vrn\left(\frac{1}{Rsr} + \frac{1}{Rrg} + \frac{1}{Rtr}\right) \quad (2)$$

where the parameters are as indicated above with n referring to the number of the test. For the three tests referred to below, n=1, 2, or 3.

In order to determine the true resistances and two foreign voltages in the circuit model of FIG. 1, i.e. five unknowns in the steady state, five simultaneous equations are required, thus requiring three tests each providing two equations as above (one equation being redundant). For convenience, a first one of these tests can comprise driving the source voltages St and Sr both to the same positive voltage (i.e. St1=Sr1) at which the measured voltages Vt1 and Vr1 have substantially full-scale measurement positive magnitudes (e.g. about 45 volts, corresponding to a 16-bit digital voltage measurement) for maximum measurement accuracy. The second test can similarly drive the voltages St and Sr to the same negative voltage (i.e. St2=Sr2) at which the measured voltages Vt2 and Vr2 have substantially full-scale measurement negative magnitudes (e.g. about −45 volts). In the third test the tip and ring wires can be driven differentially; for example the source voltage Sr being a battery voltage of −48 volts and the source voltage St being driven to the positive voltage at which the measured voltage Vt3 has its full-scale positive magnitude, equation (1) above being used as the required fifth simultaneous equation.

Solving these equations gives the following results, the foreign voltages Vft and Vfr being reflected back to the terminals T and R:

$$Rtr = \frac{(Vt3 - Vt1 - Vr3 + Vr1)(Vr2 - Vr1) - (Vt2 - Vt1 - Vr2 + Vr1)(Vr3 - Vr1)}{(St2 - St1 - Vt2 + Vt1)(Vr3 - Vr1) - (St3 - St1 - Vt3 + Vt1)(Vr2 - Vr1)} Rst$$

$$Rtg = \frac{(Vt2 - Vt1)RtrRst}{(St2 - St1 - Vt2 - Vt1)Rtr + (Vr2 - Vr1 - Vt2 + Vt1)Rst}$$

$$Rrg = \frac{(Vr2 - Vr1)RtrRsr}{(Sr2 - Sr1 - Vr2 + Vr1)Rtr + (Vt2 - Vt1 - Vr2 + Vr1)Rsr}$$

$$Vft = Vt1 - \frac{Vt1 - Vt2}{1 - St2/St1}$$

$$Vfr = Vr1 - \frac{Vr1 - Vr2}{1 - Sr2/Sr1}.$$

As has already been stated, the voltage measurements Vtn and Vrn in the above equations are the final value or steady state voltages, after any transients due to the line capacitances have died out. As shown in FIG. 2, application of a step voltage Vs via a source resistor Rs to a load resistor R1 which has a capacitance C in parallel with it causes the voltage V across the resistor R1 to rise in an exponential manner, so that only after about five times the time constant of the circuit does the voltage V across the resistor R1 reach the final or steady state value of the voltage Vs. Applying these criteria to the above tests with a maximum line capacitance of 10 $\mu$F and a resistance to ground of 10 M$\Omega$ gives a time of 500 seconds for the steady state value to be reached, for each of the three tests.

In order to avoid such delays for steady state values of the measured voltages Vtn and Vrn to be reached, the invention provides a method by which the steady state voltage can be accurately calculated, i.e. predicted, from a limited number of periodic samples of the measured voltage, with an arbitrary sampling period and at an arbitrary point before the transient voltage has died. In fact, it has been found that 9 voltage samples are required, and these are conveniently effected with a sampling period of 100 ms so that each test can be completed in about 1 second. The method also allows time domain measurement of the capacitances in the circuit model of FIG. 1, so that the three tests enable all of the parameters of the circuit model to be determined in a total time of less than five seconds.

The capacitances are determined by determining the charge flow or integral (summation of samples) of the current in the circuit, and the determination is accurate even in the presence of significant line inductances. To this end, equations (1) and (2) above are rewritten (omitting the test number n) as equations (1a) and (2a) to include the currents through the capacitors:

$$\frac{St}{Rst} + \frac{Vft}{Rtg} + \frac{vr}{Rtr} = iCtg + iCtr + Jvt \tag{1a}$$

$$\frac{Sr}{Rsr} + \frac{Vfr}{Rrg} + \frac{vt}{Rtr} = iCrg - iCtr + Jvr \tag{2a}$$

where lower case variables are now used to denote time-varying quantities, i represents current, the subscripts refer to the capacitors to which the respective currents flow, and:

$$J = \left( \frac{1}{Rst} + \frac{1}{Rtg} + \frac{1}{Rtr} \right).$$

Thus, in equations (1a) and (2a), vt and vr are the time-varying voltages at the terminals T and R respectively, and iCtg, iCrg, and iCtr are the time-varying currents flowing to the capacitors Ctg, Crg, and Ctr respectively.

As is well known, the relationship between instants t0 and t1 of time t between current i(t) and voltage v across a capacitor of capacitance C with an initial voltage V is given by the equation:

$$C\Delta v = \int_{t0}^{t1} i(t)dt \tag{3}$$

where $\Delta V = v - V$.

Choosing a constant integration interval of $T = t1 - t0$ and dividing this into a large number N of very small time elements $\Delta t$, this integral can be very closely approximated by numerical integration or summation in accordance with the equation:

$$\int_{t0}^{t1} i(t)dt = \frac{T}{N} \sum_{j=0}^{N} i(t0 + j\Delta t) = \overline{i(t)}T$$

where $\overline{i(t)}$ represents the average current over the integration interval. For example, N can be of the order of 1000, so that many sub-samples over what here is referred to as the sample period T are averaged. As discussed later below, the period T is chosen to correspond to an integral number of cycles at a.c. power line frequencies, so that the effects of a.c. power line induction on the measurement accuracy are greatly suppressed or eliminated.

Integrating equations (1a) and (2a) and applying equation (3) and this numerical integration technique results in the equations:

$$\frac{StT}{Rst} + \frac{VftT}{Rtg} + \frac{\overline{vr}T}{Rtr} = Ctg\Delta vt + Ctr(\Delta vt - \Delta vr) + J\overline{vt}T \tag{1b}$$

$$\frac{SrT}{Rsr} + \frac{VfrT}{Rrg} + \frac{\overline{vt}T}{Rtr} = Crg\Delta vr + Ctr(\Delta vr - \Delta vt) + J\overline{vr}T \tag{2b}$$

where $\overline{vt}$ and $\overline{vr}$ are averaged voltages at the terminals T and R respectively.

With three tests as already discussed above and equations of the form of equations (1b) and (2b), subtracting equations for test 2 from those for test 1, and subtracting the tip equation for test 3 from the tip equation of test 1, gives the equations:

$$\frac{St2 - St1}{Rst} - \frac{\overline{vr2} - Vr1}{Rtr} = \tag{4}$$

$$J\left( Ctg \frac{vt2 - vt1}{T} + Ctr \frac{vt2 - vt1 - vr2 + vr1}{T} + \overline{vt2} - Vt1 \right)$$

$$\frac{Sr2 - Sr1}{Rsr} - \frac{\overline{vt2} - Vt1}{Rtr} = \tag{5}$$

$$J\left( Crg \frac{vr2 - vr1}{T} + Ctr \frac{vr2 - vr1 - vt2 + vt1}{T} + \overline{vr2} - Vr1 \right)$$

$$\frac{St3 - St1}{Rst} - \frac{\overline{vr3} - Vr1}{Rtr} = \tag{6}$$

$$J\left( Ctg \frac{vt3 - vt1}{T} + Ctr \frac{vt3 - vt1 - vr3 + vr1}{T} + \overline{vt3} - Vt1 \right)$$

where the voltages denoted by an upper case V are the final or steady state voltages which are predicted in the manner discussed below. The voltages denoted by a lower case v are averaged and instantaneous voltages, for example $\overline{vt2}$ is the averaged voltage at the terminal T during test number 2, and vt2 is the instantaneous voltage at the terminal T at the beginning of test number 2.

Equations (4) to (6) can be solved simultaneously, giving the capacitance values:

$$Ctr = \frac{K1K7 - K6K2}{K3K7 - K8K2} \quad Ctg = \frac{K1 - K3Ctr}{K2}$$

$$Crg = \frac{K4 + K3Ctr}{K5}$$

where:

$$K1 = \frac{St2 - St1 - \overline{vt2} + Vt1}{Rst} + \frac{\overline{vr2} - Vr1 - \overline{vt2} + Vt1}{Rtr} + \frac{\overline{vt2} - Vt1}{Rtg}$$

$$K2 = \frac{vt2 - vt1}{T}$$

$$K3 = \frac{vt2 - vt1 - vr2 + vr1}{T}$$

$$K4 = \frac{Sr2 - Sr1 - \overline{vr2} + Vr1}{Rsr} + \frac{\overline{vt2} - Vt1 - \overline{vr2} + Vr1}{Rtr} - \frac{\overline{vr2} - Vr1}{Rrg}$$

$$K5 = \frac{Vr2 - Vr1}{T}$$

$$K6 = \frac{St3 - St1 - \overline{vt3} + Vt1}{Rst} + \frac{\overline{vr3} - Vr1 - \overline{vt3} + Vt1}{Rtr} - \frac{\overline{vt3} - Vt1}{Rtg}$$

$$K7 = \frac{vt3 - vt2}{T}$$

$$K8 = \frac{vt3 - vt2 - vr3 + vr2}{T}.$$

Thus the above equations enable the three capacitances, three resistances, and two foreign potentials in the circuit model of FIG. 1 to be determined from sampled voltage measurements made during the three tests.

An individual analysis of each of the three tests shows that the circuits are of second order. Attempting to solve such circuits in the s domain to determine the final or steady state voltage values from the limited number of measured variables requires an iterative process, which would involve extensive computation, may not converge, and is not guaranteed to produce a result. The invention provides a closed form solution, i.e. a solution which always produces a result from a predetermined set of calculations, by a process as described below in which the circuit model is transformed into the Z domain.

Initially, the circuit model of FIG. 1 is redrawn as the circuit model of FIG. 3, in which the foreign DC voltages are omitted and the resistances and capacitances are replaced by their s domain equivalent impedances, these impedances being given by the following equations:

$$Zst = Rst \qquad Zsr = Rsr$$

$$Ztg = \frac{Rtg}{1 + sRtgCtg} \qquad Zrg = \frac{Rrg}{1 + sRrgCrg}$$

$$Ztr = \frac{Rtr}{1 + sRtrCtr}.$$

The analysis can be divided into two identical parts because of symmetry and superposition, in each case with only one source voltage St or Sr. It is assumed here for analysis that Sr=0, so that the model of FIG. 3 can be simplified and redrawn as FIG. 4. This model is then solved for Vt(s) and Vr(s), using an impedance Z1 to represent Arg in parallel with Zsr, and an impedance Z2 to represent the series combination of Z1 and Ztr in parallel with Ztg. Then:

$$Vt(s) = \frac{Z2 St(s)}{Z2 + Zst} \qquad Vr(s) = \frac{Z1 Vt(s)}{Z1 + Ztr}$$

and hence:

$$Vt(s) = \frac{at(1 + bts)}{c + ds + es^2} \qquad Vr(s) = \frac{ar(1 + brs)}{c + ds + es^2}$$

where:

$$at = Rtg(RrgRsr + RrgRtr + RsrRtr) \qquad ar = RrgRsrRtg$$

$$bt = \frac{(Crg + Ctr)RrgRsrRtr}{RrgRsr + RrgRtr + RsrRtr} \qquad br = CtrRtr$$

$$c = RrgRsr(Rst + Rtg) + RtgRst(Rrg + Rsr) + Rtr(Rtg + Rst)(Rrg + Rsr)$$

$$d = (Crg + Ctg)RrgRsrRstRtr + (Crg + Ctr)(Rtg + Rst)RrgRsrRtr + (Ctg + Ctr)(Rrg + Rsr)RstRtgRtr$$

$$e = (CrgCtg + CrgCtr + CtgCtr)RrgRsrRstRtgRtr.$$

The time domain voltages Vt and Vr are found by taking the inverse Laplace Transform of the above equations for Vt(s) and Vr(s) to yield in each case an equation of the form:

$$V(t) = \frac{a}{c}\left(1 - \frac{(-2bc + d + f)}{2f E^{((d-f)t/2e)}} - \frac{(2bc - d + f)}{2f E^{((d+f)t/2e)}}\right)$$

where E is the natural logarithm constant (a capital being used to distinguish it from the parameter e used above), and:

$$f = \sqrt{d^2 - 4ce}.$$

This equation can be rearranged as:

$$V(t) = Vf(1 + Kp2 E^{p1 t} - Kp1 E^{p2 t})$$

where Vf is the final or steady state voltage, p1 and p2 are the poles of the system, and Kp1 and Kp2 are constants, these being given by the equations:

$$Vf = \frac{a}{c} \qquad p1 = \frac{(-d + f)}{2e} \qquad p2 = \frac{(-d - f)}{2e}$$

$$K_{p1} = \frac{(bc + ep1)}{f} \qquad K_{p2} = \frac{(bc + ep2)}{f}.$$

In order to predict the final voltage Vf from periodic samples of the voltage during the transient, the s-plane is mapped into the z-plane and a difference equation is determined which would be the solution of the above system poles (and zeros). This can be done either using the bilinear transform or the matched pole-zero (MPZ) technique. The latter is used here because it avoids frequency distortion which is inherent in the bilinear transform.

Samples of the tip and ting voltages are treated in the same way to determine the final or steady state voltages Vt and Vr; for simplicity only the tip voltage is discussed below.

The s-plane representation for the tip voltage Vt(s) is given by:

$$Vt(s) = \frac{at(1 + bts)}{c + ds + es^2} \cdot \frac{1}{s}$$

with poles p1 and p2 as defined above and one zero at z=−1/b. Applying the MPZ technique to Vt(s) gives the following poles and zeros for the z-transform representation:

$$P1 = E^{p1 T} \quad P2 = E^{p2 T} \quad Z = E^{-T/b}$$

giving an equation:

$$Vn(z) = k\frac{z - E^{-T/b}}{(z - E^{p1 T})(z - E^{p2 T})}$$

where:

$$k = \frac{at}{c} \cdot \frac{(-1 + E^{p1 T})(-1 + E^{p2 T})}{(-1 + E^{T/b})}.$$

The z-transform of this equation in alternative terms is:

$$k\frac{-E^{-T/b}z^{-3} + z^{-2}}{1 + (-(E^{p1 T} + E^{p2 T}))z^{-1} + E^{(p1 + p2)T}z^{-2}}$$

This z-transfrom has the form:

$$k \frac{b3z^{-3} + z^{-2}}{1 + a1z^{-1} + a2z^{-2}}$$

where a1, a2, and b3 are constants given by the equations:

$$a1 = -(E^{p1T} + E^{p2T}) \quad A2 = E^{(p1+p2)T} \quad b3 = -E^{-T/b}$$

which yields a difference equation of the form:

$$y(n) = b3kx(n-3) + kx(n-2) - a1y(n-1) - a2y(n-2).$$

The response of this z-transform to a unit step is the tip voltage Vt(t). In other words, with x(n)=unit step, y(n)=Vt(t). For the desired prediction purpose and with b2=b3k+k, the difference equation is:

$$y(n) = b2 - a1y(n-1) - a2y(n-2).$$

As should be appreciated, the values of y in the above difference equation are the samples of the tip voltage at successive sampling times n−2, m−1, and n, with an arbitrary sampling period T. The steady state is that in which y(n)=y(n−1)=y(n−2)=Vf. Substituting and solving the difference equation for Vf gives the equation:

$$Vf = \frac{b2}{1 + a1 + a2}.$$

In order to determine the values of the three unknowns a1, a2, and b2 from the measured voltages y at the sampling times, three linear and independent equations, derived from the above difference equation, are required. As each equation involves three samples, and independence of the equations requires that the samples be different in different equations, nine samples are required to predict the final or steady state voltage Vf. Referring to these samples for brevity as Y1 (the earliest sample) to Y9 (the last sample) and putting these values into the difference equation gives the three linear and independent equations:

$$Y3 = b2 - a1Y2 - a2Y1$$

$$Y6 = b2 - a1Y5 - a2Y4$$

$$Y9 = b2 - a1Y8 - a2Y7.$$

These equations are the same as the more conventionally expressed equations:

$$y(n-6) = b2 - a1y(n-7) - a2y(n-8)$$

$$y(n-3) = b2 - a1y(n-4) - a2y(n-5)$$

$$y(n) = b2 - a1y(n-1) - a2y(n-2).$$

Solving these equations for a1, a2, and b2 gives:

$$a1 = (Y3(Y7-Y4) + Y6(Y1-Y7) + y9(Y4-Y1))/Y$$

$$a2 = (Y3(Y5-Y8) + Y6(Y8-Y2) + Y9(Y2-Y5))/Y$$

$$b2 = (Y3(Y7Y5-Y8Y4) + Y6(Y8Y1-Y7Y2) + Y9 \cdot (Y4Y2-Y5Y1))/Y$$

where:

$$Y = Y7Y5 - Y8Y4 - Y7Y2 + Y4Y2 + Y8Y1 - Y5Y1.$$

As indicated above, the sampling period T is arbitrary. In practice, it is convenient to choose a sampling period T which corresponds to a whole number of periods of the ac power frequency, typically 50 or 60 Hz, so that the effects of any ac induction on the telephone line being measured are eliminated. Accordingly, a sampling period of 100 ms, corresponding to 5 cycles at 50 Hz or 6 cycles at 60 Hz, is particularly convenient. A longer sampling period leads to increased accuracy but also results in a directly increased measurement time.

As also discussed above, the actual sampling rate is much higher than this, N sub-samples being averaged over each sample period T, thereby reducing the effects of noise and sampling errors.

Thus in accordance with the invention as described above, and as illustrated by the flow chart in FIG. 5, for measuring the characteristics of a telephone line the three described tests are performed successively on the line (source voltages being coupled as shown at block 10, for each of the three tests counted at decision block 18 in FIG. 5), and during these tests the tip and ring voltages are monitored by sampling block 12 in FIG. 5). The voltage measurements from nine consecutive samples (counted at decision block 14 in FIG. 5) are used in each case in the above equations to calculate a predicted final or steady state value of the tip or ting voltage (block 16 in FIG. 5), the respective test then being terminated without requiring that this steady state condition be reached. The calculated final values of the voltages are used, in conjunction with the known voltages St and Sr, in the equations for Rtr, Rtg, Rrg, Vft, and Vfr to determine these parameters (block 20 in FIG. 5). The calculated final values, known voltages St and Sr and sampling period T, calculated resistance values, and transient values of the sampled voltages are used in the equations for K1 to K8, and hence Ctr, Ctg, and Crg, to determine these parameters. Thus all of the parameters of the circuit model of FIG. 1 are consistently determined in an accurate and rapid manner.

Although it is preferred, for the most rapid measurement of each telephone line, for the nine samples discussed above to be consecutive, this need not necessarily be the case. As the difference equation involves three consecutive samples, obviously any three sets each of three consecutive samples could be used instead. For example, samples Y1 to Y3, Y5 to Y7, and Y8 to Y10 could be used from a total of ten consecutive samples Y1 to Y10, with direct substitution of the samples actually used in the above equations.

Furthermore, difference equations using non-consecutive but periodic samples may be derived using the same principles as described above, and an alternative set of equations using such equations to calculate the predicted final or steady state voltage from these samples may be developed in a similar manner to enable calculation of the telephone line characteristics in the closed form second order manner described above.

Thus although the preferred embodiment of the invention has been described in detail, it should be appreciated that numerous modifications, variations, and adaptations may be made without departing from the scope of the invention as defined in the claims.

What is claimed is:

1. A method of measuring characteristics of a two-wire telephone line a circuit model of which comprises resistive and capacitive elements connected between tip, ring, and ground terminals of the line, comprising the steps of:

> coupling source voltages via source resistances to the tip and ring terminals in a plurality of test conditions;
>
> in each test condition, determining a steady state voltage of at least one of the tip and ring terminals; and
>
> deriving characteristics of the resistive elements of the line from the source voltages, source resistances, and determined steady state voltages;
>
> wherein the step of determining each steady state voltage of a terminal comprises the steps of:
>
> sampling the voltage at the terminal with a predetermined sampling period to provide a predetermined set of sampled voltages; and
>
> calculating a predicted voltage value, constituting the determined steady state voltage, from the predetermined set of sampled voltages using a closed form second order solution of the circuit model.

2. A method as claimed in claim 1 wherein the predetermined set of sampled voltages comprises nine samples.

3. A method as claimed in claim 1 wherein the predetermined set of sampled voltages comprises three sets each of three consecutive samples.

4. A method as claimed in claim 3 wherein the predicted voltage value is equal to $b2/(1+a1+a2)$, where $a1$, $a2$, and $b2$ are determined by linear independent equations:

$$Y3 = b2 - a1\ Y2 - a2\ Y1$$

$$Y6 = b2 - a1\ Y5 - a2\ Y4$$

$$y9 = b2 - a1\ Y8 - a2\ Y7$$

where Y1 to Y3, Y4 to Y6, and Y7 to Y9 are the three consecutively sampled voltages in the three sets, respectively.

5. A method as claimed in claim 1 wherein the predetermined set of sampled voltages comprises nine consecutive samples.

6. A method as claimed in claim 5 wherein the predicted voltage value is equal to $b2/(1+a1+a2)$, where:

$$a1 = (Y3(Y7-Y4) + Y6(Y1-Y7) + Y9(Y4-Y1))/Y$$

$$a2 = (Y3(Y5-Y8) + Y6(Y8-Y2) + Y9(Y2-Y5))/Y$$

$$b2 = (Y3(Y7Y5-Y8Y4) + Y6(Y8Y1-Y7Y2) + Y9(Y4Y2-Y5Y1))/Y$$

$$Y = Y7Y5 - Y8Y4 - Y7Y2 + Y4Y2 + Y8Y1 - Y5Y1$$

and Y1 to Y9 are the nine consecutively sampled voltages.

7. A method as claimed in claim 1 wherein the circuit model comprises tip-to-ring, tip-to-ground, and ring-to-ground resistances and tip and ring foreign voltages, and the plurality of test conditions comprise three different test conditions which provide five equations by which the resistances and foreign voltages are derived from the source voltages, source resistances, and determined steady state voltages.

8. A method as claimed in claim 7 wherein the circuit model further comprises tip-to-ring, tip-to-ground, and ring-to-ground capacitances and the three different test conditions provide three equations in the time domain by which the capacitances are derived.

9. A method as claimed in claim 1 wherein the predetermined sampling period is an integer multiple of the period of a 60 Hz ac waveform.

10. A method as claimed in claim 1 wherein the predetermined sampling period is 100 ms.

11. A method as claimed in claim 6 wherein the circuit model comprises tip-to-ring, tip-to-ground, and ring-to-ground resistances and tip and ring foreign voltages, and the plurality of test conditions comprise three different test conditions which provide five equations by which the resistances and foreign voltages are derived from the source voltages, source resistances, and determined steady state voltages.

12. A method as claimed in claim 11 wherein the circuit model further comprises tip-to-ring, tip-to-ground, and ring-to-ground capacitances and the three different test conditions provide three equations in the time domain by which the capacitances are derived.

13. A method as claimed in claim 12 wherein the predetermined sampling period is an integer multiple of the period of a 60 Hz ac waveform.

14. A method as claimed in claim 12 wherein the predetermined sampling period is 100 ms.

* * * * *